United States Patent [19]
Raonic et al.

[11] Patent Number: 5,796,599
[45] Date of Patent: Aug. 18, 1998

[54] SELF-POWERED GATE DRIVER BOARD

[75] Inventors: Dusan Raonic. Brampton; David S. MacLennan. Ayr. both of Canada; Didier G. Rouaud. Twinsburg. Ohio

[73] Assignee: Reliance Electric Industrial Company. Cleveland. Ohio

[21] Appl. No.: 816,445

[22] Filed: Mar. 12, 1997

[51] Int. Cl.$^6$ .................................................. H02M 7/122
[52] U.S. Cl. .................................................. 363/57; 327/441
[58] Field of Search .......................... 363/54, 57, 85, 363/96, 128, 135, 136; 327/440, 441, 448, 450

[56] References Cited

U.S. PATENT DOCUMENTS

| | | | |
|---|---|---|---|
| 4,475,139 | 10/1984 | Chadwick | 361/91 |
| 4,634,891 | 1/1987 | Yamagami | 327/441 |
| 4,697,219 | 9/1987 | Mitsuoka | 361/93 |
| 5,298,848 | 3/1994 | Ueda et al. | 318/811 |

*Primary Examiner*—Matthew V. Nguyen
*Attorney, Agent, or Firm*—Michael A. Jaskolski; John M. Miller; John J. Horn

[57] ABSTRACT

A method and/or apparatus used with a thyristor based AC-AC motor controller in a discontinuous current mode for providing power to thyristor gate drivers. The apparatus includes a snubber network and two rechargeable capacitors for storing input line voltage to an inversely connected pair of thyristors when both the thyristors are off. Stored voltage is provided via a power lead to each thyristor driver to provide power thereto and thus the circuit operates in a self-powered manner.

11 Claims, 4 Drawing Sheets

SELF-POWERED GATE DRIVER BOARD

BACKGROUND OF THE INVENTION

The present invention relates to circuitry for controlling the firing of thyristors and more particularly to self-powered circuitry for providing power to thyristor drivers.

One common type of motor control system is an AC—AC thyristor based system wherein sinusoidal AC supply voltage is altered by controlling a notch angle in the voltage waveform to produce an altered output voltage and associated output current which lags the output voltage by a power factor angle Φ. For a three phase motor, typically three separate thyristor based switches are provided, each switch comprising a pair of silicon controlled rectifiers (SCR) that are connected in inverse parallel relationship. A separate sinusoidal supply voltage is provided at an input of each switch. An output of each switch is connected to a separate one of the three motor phases. Each SCR includes a gate electrode for turning the SCR on.

As well known in the controls art, when a short positive gate current is applied to an SCR gate electrode, an associated SCR turns on and becomes conducting in its forward biased direction. Once an SCR is turned on it is latched on and the gate current can be removed. The SCR cannot be turned off by the gate and the SCR conducts as a diode. Only when the SCR's anode current tries to go negative, under the influence of the circuit in which the SCR is connected, does the SCR turn off. This allows the gate to regain control of the SCR in order to turn the SCR on at some controllable time thereafter.

In the three-phase motor example above, in order to simplify this explanation only one of the three thyristor switches will be explained in detail. However, it should be understood that all of the switches operate in the same manner. For the purposes of this explanation the SCR in a thyristor switch pair that has its anode connected to the input line will be referred to as a first SCR and the other SCR (i.e. the SCR having its cathode connected to the input) will be referred to as a second SCR.

The first SCR is used to control the shape of positive half-cycles of the output voltage and current. After the current through the first SCR reaches zero the first SCR turns off and remains off until a gate pulse is applied to the first SCR's gate electrode some time during the following positive half-cycle of the supply voltage. By controlling the time of the next gate current, the positive current provided through the motor windings is controlled.

The second SCR is used to control the shape of negative half-cycles of the output voltage and current in a similar manner by controlling the times of the gate pulses to the second SCR during negative half-cycle supply voltage periods.

When an SCR turns off, the rate of voltage rise across the SCR increases rapidly and can instantaneously overshoot a maximum safe level. To protect the SCR's against excessive voltage, typical control systems include an RC snubber network comprising of a resistor and a capacitor in series across the thyristor switch input and output (i.e. in parallel with both the first and second SCRs). When an SCR turns off, the capacitor charges and thereby provides a time constant which limits the rate of rise of voltage across the SCRs to an acceptable value. The capacitor discharges through the series resistor to dissipate energy in the form of heat.

In addition to the basic thyristor switch circuits described above, a typical three-phase thyristor based motor control system also requires six gate driver circuits, one gate driver circuit for each gate electrode. Each driver circuit includes circuitry for determining when an associated SCR should be turned on to generate desired output current and includes circuitry for turning the SCR on.

Moreover, each gate driver requires power. Presently, driver power is provided using a plurality of power sources including a separate power source for each driver. Thus, where a control system includes six drivers, six power sources are required.

In some medium and high voltage systems, high output voltage is provided by stacking thyristor based systems together. For example, output voltage can be approximately doubled by providing two series connected thyristor drivers. In this case, output terminals for a first thyristor driver would be connected to the input terminals for a second thyristor driver, whose output would be connected to the load.

While stacked systems can provide high voltage capability, stacked systems require many more components, including many more power supplies. For example, where two systems are stacked to provide three phase double output voltage, twelve drivers and twelve separate power supplies must be provided, a separate driver and supply for each SCR.

Unfortunately systems that require many power supplies have several drawbacks. First, every time an additional component is required to provide a system, the cost of the system is increased. This is particularly true in the case of power supplies which typically require a transformer and at least some basic form of control circuitry.

Second, additional components appreciably increase the physical size of a system. In the case of a single simple power supply required space may not be appreciable. However, where six or more power supplies are needed, required space is substantial.

Third, additional components also increase the likelihood that one or more components will fail which increases maintenance costs and reduces system reliability.

Fourth, supply transformers generate a large amount of heat which is commonly dissipated into the control system generally and can affect system operation. In addition, transformers also have a tendency to generate stray magnetic flux which can cause electronic circuitry to malfunction.

To reduce stray flux and minimize the effects of transformer heat, often, magnetic shielding and heat absorbing insulation is provided around each transformer which further increases the space required to house the power supplies.

One solution to reduce the space required by the power supplies would be to provide a single power supply that can provide power to all of the gate drivers. While a single supply would likely reduce the overall space required by a system, a single supply would be relatively more complex and more costly to manufacture. In addition, if the single supply failed, it would be more costly to fix the supply due to its complexity. Furthermore, where a single power supply is provided for all system drivers, many differently sized power supplies would have to be designed and manufactured to provide power to stacked medium and high voltage systems increasing development and manufacturing costs.

Thus, it would be advantageous to have a thyristor based motor control system that can be driven by a simple power supply comprising minimal, inexpensive and durable components that does not require a large amount of space.

SUMMARY OF THE INVENTION

The present invention includes an apparatus for providing power to gate driver circuits in a thyristor based AC—AC controller. With the present invention, instead of providing separate power supplies for each driver, a rechargeable storer, preferably in the form of a capacitor, is provided for each driver. The capacitors are charged by an input line voltage every time both of the thyristors are off and are charged by a snubber network every time one of the thyristors is turned on or off. The rechargeable capacitors are connected to power leads for the thyristor driver circuits to provide power thereto.

Preferably, the invention includes a circuit for turning on at least first and second thyristors, each thyristor having an anode, a cathode and a gate electrode, the anode and cathode of the first thyristor connected to the cathode and anode of the second thyristor, respectively, the first thyristor anode connected to a voltage source providing a substantially sinusoidal voltage and the first thyristor cathode connected to a terminal. The circuit includes a driver linked to the thyristor gate electrodes for turning on the thyristors, the driver including a power lead for receiving power required to drive the driver. A snubber voltage storer is linked between the anode and the cathode of the first thyristor via the rechargeable voltage storers which snubber charges when either of the thyristors is turned off and discharges when either of the thyristors is turned on. Rechargeable voltage storers are linked to, and chargeable by, the snubber storer when either of the thyristors is turned on or off and chargeable by the voltage source when both of the thyristors are off. The rechargeable storer is linked to the driver to supply power thereto.

One object of the invention is to provide a self-powered driver circuit for driving thyristor switches. The rechargeable storers are continually charged so that voltage is provided to the driver and separately dedicated power supplies are not required.

Another object is to reduce the space required for a thyristor driver circuit. The storers required in the present invention can be constructed using relatively small components and therefore space required to house the storers is minimal when compared to the space required to accommodate a plurality of power supplies.

Yet another object is to reduce the overall cost of a driver system. A rechargeable storer typically includes suitably sized capacitors, diodes and thyristor, all standard and inexpensive electronic components.

A further object is to reduce system heating and stray magnetic flux associated with typical power supplies. To this end the present circuit does not require a transformer, but instead uses capacitors and other solid state devices that generate less heat than a transformer and do not typically generate appreciable magnetic flux.

One other object is to provide a system that uses energy which would otherwise be dissipated in the snubber network as heat. In the inventive circuit, when both of the thyristor switches are off, in addition to charging the snubber capacitor, one of the rechargeable capacitors is charged by the supply line voltage so that supply line voltage is stored for later use. In addition, when one of the thyristor switches is turned on, the snubber capacitor discharges into one of the rechargeable capacitors so that snubber charge is stored for later use. In this way, some of the power which would typically be wasted in the RC snubber network, is stored for driving the driver circuits at a later time.

Preferably the at least two thyristors include two thyristors and the driver includes first and second drivers. The first driver is connected to the second thyristor gate electrode and the second driver is connected to the first thyristor gate electrode. The rechargeable voltage storer includes first and second rechargeable storers linked to the snubber storer. The first rechargeable storer is linked to the first driver to supply power thereto and the second rechargeable storer is linked to the second driver to supply power thereto. The first rechargeable storer is chargeable by the snubber storer when the first thyristor is turned on and chargeable by the voltage source when the first thyristor is turned off and the voltage at the first thyristor anode is negative. The second rechargeable storer is chargeable by the snubber storer when the second thyristor is turned on and chargeable by the voltage source when the second thyristor is turned off and the voltage at the first thyristor anode is positive.

The first rechargeable storer includes a first power capacitor connected between the first driver power lead and the second thyristor cathode and the second rechargeable storer includes a second power capacitor connected between the second driver power lead and the first thyristor cathode. The first rechargeable storer may also include a first zener diode having an anode linked to the cathode of the second thyristor and a cathode linked to the first power lead, a first diverting thyristor having an anode linked to the snubber resistor, a cathode linked to the second thyristor cathode and a gate terminal connected to the first zener diode anode, a first regulating diode having an anode connected to the first diverting thyristor anode and a cathode connected to the first zener diode cathode and the first driver power lead and a first bypass diode having an anode connected to the cathode of the first diverting thyristor and a cathode connected to the first diverting thyristor anode. The second rechargeable storer may also include a second zener diode having an anode linked to the cathode of the first thyristor and a cathode linked to the second power lead. A second diverting thyristor has a cathode linked to the first thyristor cathode, a gate terminal connected to the second zener diode anode and an anode connected to the snubber capacitor, and a second bypass diode has an anode connected to the second thyristor anode and a cathode connected to the second diverting thyristor anode. The snubber storer is linked to the first thyristor anode through the first bypass diode and to the first thyristor's cathode through the second bypass diode.

Thus, another object of the invention is to limit the maximum value of charge on the rechargeable power capacitors so that capacitor size can be minimized. Only a finite amount of power is required to drive the drivers. By limiting the maximum capacitor charge to the power required by a connected driver, the size of the power capacitor can be minimize to reduce system space.

Moreover, the first driver further includes a first resistor linking the first zener diode anode to the second thyristor cathode. The second driver may further include a second resistor linking the second zener diode anode to the first thyristor cathode.

The invention also includes a method for use with the circuit described above.

Other and further objects and aspects of the present invention will become apparent during the course of the following description and by reference to the accompanying drawings.

BRIEF DESCRIPTION OF THE SEVERAL
VIEWS OF THE DRAWINGS

FIG. 5 is similar to FIG. 3 except that the first thyristor is turned on;

FIG. 6 is similar to FIG. 4 except that the second thyristor is turned on;

DETAILED DESCRIPTION OF THE INVENTION

A. Configuration

Figure 1:
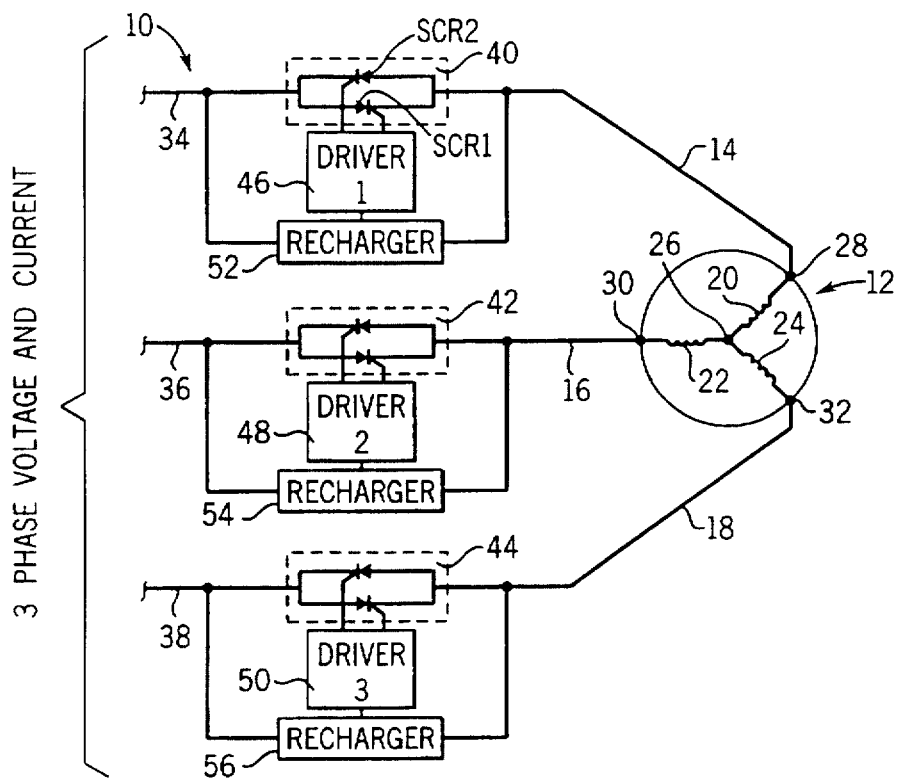
FIG. 1 is a schematic diagram of a motor and a controller which incorporates the present invention.

Referring now to the drawings, wherein like reference characters represent corresponding elements throughout the several views, and more specifically, referring to FIG. 1, the present invention will be described in the context of the exemplary motor control system 10 which is used to control an induction motor 12. The induction motor 12 has three stator windings 20, 22, 24 which are coupled in a Y-configuration at neutral node 26. The distal end of each stator winding 20, 22, 24 is at connected to a separate terminal lead 14, 16 or 18 at a motor terminal 28, 30 or 32, respectively. Each of the terminal leads 14, 16 and 18 is connected to a separate supply line 34, 36 or 38 through a unique thyristor switch 40, 42 or 44, respectively. The phase of the voltage on supply line 34 leads the phase of the voltage on supply 36 which in turn leads the phase of the voltage on supply line 38, each of the supply line voltages leading the following voltage by precisely 120 electrical degrees.

In addition, the control system 10 includes three separate drivers 46, 48 and 50, each of which is powered by a separate rechargeable storer or recharger 52, 54 and 56, respectively. Each driver 46, 48 or 50 includes gate circuitry for determining when devices in associated thyristor switches 40, 42, or 44 should be turned on and also includes circuitry for turning on those devices. Each recharger 52, 54 and 56 is connected to an associated thyristor switch 40, 42, or 44. Each thyristor switch 40, 42 and 44 is used to control a voltage at, and current through, an associated terminal 28, 30, or 32.

Figure 2A:
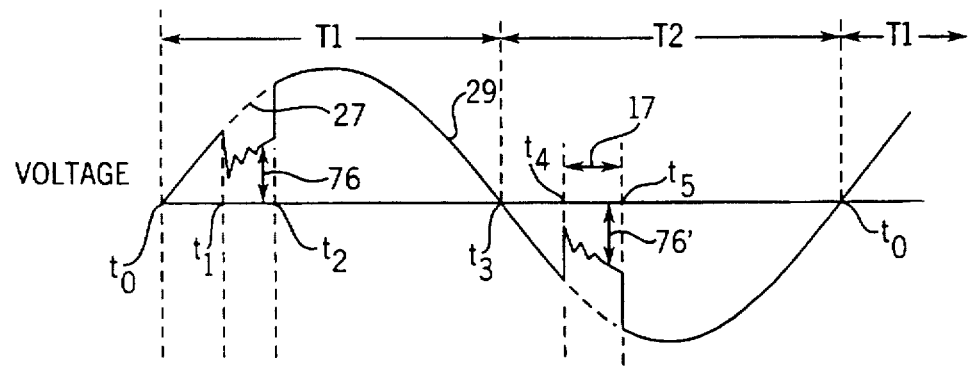
FIGS. 2a and 2b are graphs illustrating the voltage across and current through a pair of SCR's in FIG. 1 as a function of time.
Figure 2B:
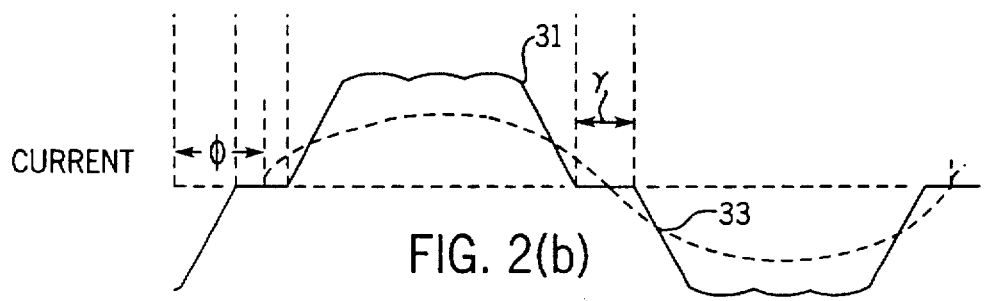

Referring also to FIGS. 2a and 2b, the current through, and voltage at, a single terminal 28, 30, or 32 of the motor 12 may be compared to the voltage of the AC source supplied on lines 34, 36 and 38. In FIG. 2a the supply line voltage 27 is sinusoidal, having alternating positive T1 and negative T2 half-cycles. The terminal voltage 29 is generally identical to the supply voltage 27, except for during a small nonconducting time, or notch 17 having a duration of γ, which is introduced into each half-cycle of supply voltage 27. The notch 17 is introduced into the supply voltage 27 each time an associate line current 31 falls to zero. The line current 31 remains zero until the end of the notch 17, at which time the current 31 continues a pulsating waveform having a fundamental sinusoidal component 33 which generally lags terminal voltage 29 by a power factor angle Φ of the motor.

The control system 10 used in the present invention alters supply line current by controlling the period of notch 17. During the duration γ, the thyristor pair comprising one thyristor switch 40, 42, or 44 and connecting one stator winding 20, 22, or 24 to the voltage source operates as an open circuit, so that, instead of observing the sinusoidal supply voltage at the terminal 28, 30, or 32, an internally generated motor back EMF voltage 76 may be seen. This gives the notch 17 in the observed waveform at the terminals 28, 30, or 32.

In order to simplify this explanation, because each of the thyristor switches 40, 42 and 44 and associated drivers and rechargers operate in an identical manner, only one thyristor switch 40 and its associated driver 46 and recharger 52 will be explained in detail. However, it should be understood that the following explanation pertains to each of the thyristor switches 40, 42 and 44 and their associated drivers and rechargers.

Switch 40 includes two inversely connected silicone controlled thyristors SCR1 and SCR2 wherein the anode of a first SCR1 of the two thyristors is connected to supply line 34 and the cathode of the first thyristor SCR1 is connected to the terminal 28 and the anode of the second thyristor SCR2 is connected to terminal 28 while its cathode is connected to supply line 34.

Referring still to FIGS. 1, 2a and 2b, initially, between $t_1$ and $t_2$, the supply line voltage 27 is in a positive half cycle T1, both SCR1 and SCR2 are off and therefore SCR1 and SCR2 initially act as open circuits between the supply line 34 and terminal 28. Because the thyristors SCR1 and SCR2 operate as open circuits between times $t_1$ and $t_2$, as can be seen in FIG. 2b no current travels through the switch 40. At time $t_2$, the first thyristor SCR1 is turned on and therefore the terminal voltage 29 at terminal 28 increases and begins to track the supply line voltage 27 on line 34. The voltage at terminal 28 causes the current 31 through terminal 28 to flow.

The line 34 and terminal 28 voltages continue along a sinusoidal path and enter a negative half-cycle T2 at time $t_3$. However, because the terminal current 31 lags the terminal voltage 29 by power factor angle Φ, the terminal current 31 does not fall to zero until time $t_4$. At time $t_4$, when the terminal current 31 reaches zero, the first thyristor SCR1 turns off and the terminal voltage 29 drops and forms the beginning of notch γ in the negative half-cycle T2 of the terminal voltage 29.

Referring still to FIGS. 1, 2a and 2b, between times $t_4$ and $t_5$ both the first and second thyristors SCR1 and SCR2 are off and therefore the back EMF 76' appears at terminal 28. At time $t_5$, the second thyristor SCR2 is turned on, the terminal voltage 29 decreases and starts tracking the input line voltage 27 and negative terminal current 31 begins to flow through the second thyristor SCR2.

After the negative half-cycle T2, the next positive half-cycle T1 begins at to where the supply line voltage 27 again becomes positive. In FIG. 2a, for the purposes of this explanation, it will be assumed that the next positive half-cycle T1 at the right hand side of the figure will be identical to the first positive half-cycle T1 at the left hand side and therefore explanation of switching operation will continue with reference to the left hand side of FIGS. 2a and 2b. Between times $t_0$ and $t_1$, the negative current 31 continues to pass through the second thyristor SCR2. At time $t_1$ the terminal current 31 reaches zero and the second thyristor SCR2 turns off. Again, both the first and second thyristor SCR1 and SCR2 remain off between times $t_1$ and $t_2$. At time $t_2$, once again, the first thyristor SCR1 is turned on. By controlling the SCR off times (i.e. width γ), both the terminal voltage 29 and the resulting terminal current 31 are controlled.

Figure 3:
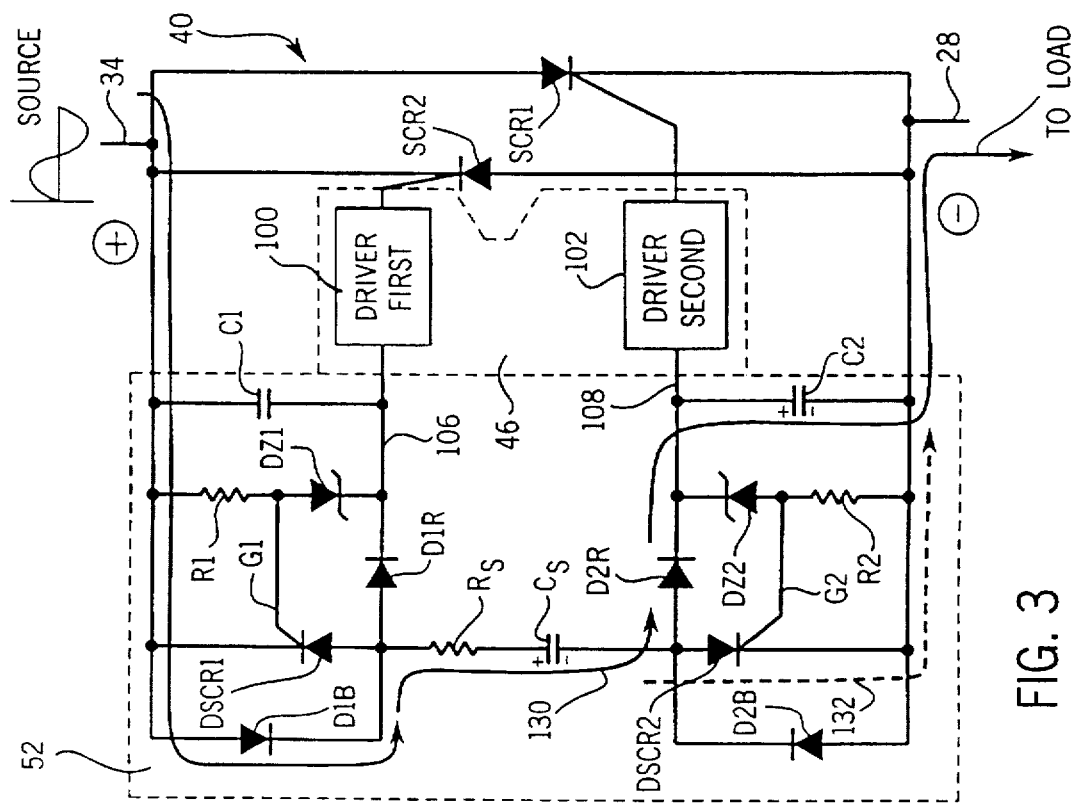
FIG. 3 is a schematic diagram of one of the thyristor switches shown in FIG. 1 and an associated driver and snubber/rechargeable storer showing operation of the inventive circuit when both of the thyristors are off and during a positive half-cycle of supply voltage.

Referring now to FIG. 3, thyristor switch 40 and its associated driver 46 and recharger 52 are illustrated in greater detail. The driver 46 includes first and second drivers 100 and 102, respectively. The first driver 100 provides gate turn on pulses to the second thyristor SCR2 to turn on the second thyristor SCR2. Similarly, the second driver 102 provides gate turn on pulses to the first thyristor SCR1 to turn on the first thyristor SCR1. Power for the first and second drivers 100, 102 is provided by the recharger 52. Each of the first and second drivers 100 and 102 has a power lead 106 or 108 which is linked to the recharger 52.

The recharger 52 includes a snubber capacitor $C_s$ and a snubber resistor $R_s$ which together form a series snubber network for limiting the maximum voltage across the first and second thyristors SCR1 and SCR2. The other components shown in the recharger 52 form the, rechargeable power supplies or voltage storers. Energy is stored in two rechargeable storers which take the form of a first capacitor C1 and a second capacitor C2. The first capacitor C1 is connected between the supply line 34 and the first driver power lead 106 and the second capacitor C2 is connected between the terminal 28 and the second driver power lead 108.

In addition to the first and second capacitors C1 and C2, the recharger 52 also includes a first resistor R1 in series with a first zener diode which are together in parallel with the first capacitor C1, the cathode of the zener diode DZ1 connected to the first driver power lead 106. A first regulating diode D1R has a cathode connected to the first driver power lead 106 and an anode connected to an end of the snubber resistor $R_s$ opposite the end connected to the snubber capacitor $C_s$. A first diverting thyristor DSCR1 has an anode connected to the first regulating diode's anode and a cathode connected to supply line 34. The first zener diode's anode is connected to a gate electrode G1 of the first diverting thyristor DSCR1 for turning the first diverting thyristor DSCR1 on. A first bypass diode D1B is connected in parallel with the first diverting thyristor DSCR1 with an anode connected to the cathode of the diverting thyristor DSCR1 and a cathode connected to the anode of the diverting thyristor DSCR1

The recharger also includes a second zener diode DZ2 in series with a second resistor R2 which are together in parallel with the second capacitor C2 wherein the cathode of the second zener diode DZ2 is connected to the second driver power lead 108. A second regulating diode D2R has a cathode connected to the second driver power lead 108 and an anode connected at an end of the snubber capacitor $C_s$ opposite the end connected to the snubber $R_s$. A second diverting thyristor DSCR2 has an anode connected to the anode of the second regulating diode D2R and a cathode connected to the terminal 28. The anode of the second zener diode DZ2 is connected to a gate electrode G2 of the second diverting thyristor DSCR2 for turning DSCR2 on. A second bypass diode D2B is connected in inverse parallel relationship with the second diverting thyristor DSCR2 so that an anode is connected to the second diverting thyristor's cathode and a cathode is connected to the second diverting thyristor's anode.

B. Operation

During operation of the circuit described above to turn on the first and second thyristors SCR1 and SCR2, the circuit continually self-powers itself by storing supply line energy so that there is always power provided to the first and second drivers 100 and 102. To this end, the snubber components, and in particular the snubber capacitor $C_s$, operates to store some of the supply line voltage 27 when both the first and second thyristors SCR1 and SCR2 are off. In addition, the first and second capacitors C1 and C2 are charged when both the first and second thyristor SCR1 and SCR2 are off. The snubber stored power is used to charge either the first or the second capacitor C1 and C2 when one of the thyristors is turned on or off. The first and second capacitors C1 and C2 are routinely charged as the supply voltage alternates between positive and negative half-cycles. Thus, each of the first and second capacitors C1 and C2 operates as a rechargeable battery or voltage storer to provide power to associated power leads 106, 108, respectively. In this way, conventional transformer based power sources are not required to provide power to the drivers 100 and 102 and the small number of components shown in FIG. 3 can be used to provide driver required power.

1. Power Up Process

Referring still to FIG. 3, in operation, initially all of the circuit capacitors $C_s$, $C_1$ and $C_2$ are completely discharged and therefore cannot provide power to the first and second drivers 100 and 102. Therefore, prior to using the first and second thyristors SCR1 and SCR2 to control voltage at terminal 28, an initial power up operation must be performed to charge the first and second capacitors C1 and C2 and provide power at the power leads 106 and 108, respectively.

Referring also to FIGS. 2a and 2b, during an initial power up process, both the first and second thyristors SCR1 and SCR2 remain off so that no current (other than device leakage current) passes between the supply line 34 and the terminal 28 through the thyristors SCR1 and SCR2. During the power up process, a sinusoidal supply voltage is provided on supply line 34. Assuming an initial positive supply voltage half-cycle T1, current travels along the path indicated by arrow 130 from supply line 34 through the first bypass diode D1B, through the snubber resistor $R_s$ and snubber capacitor $C_s$, through the second regulating diode D2R and down through the second capacitor C2. During this procedure, both the snubber capacitor $C_s$ and the second capacitor C2 becomes charged with their top plates positive as illustrated.

After a small number of positive half-cycles T1, the second capacitor C2 becomes charged to the point where its charge exceeds the clamp value of the second zener diode DZ2. At this point, voltage at the anode of the second zener diode DZ2 provides a gate current to the second diverting thyristor DSCR2 turning the second diverting thyristor on. When the second diverting thyristor DSCR2 is turned on current is diverted therethrough along the path indicated by dashed arrow 132 so that charge on the second capacitor C2 is limited to a maximum value (i.e. a value sufficient to power the second driver 102).

Figure 4:
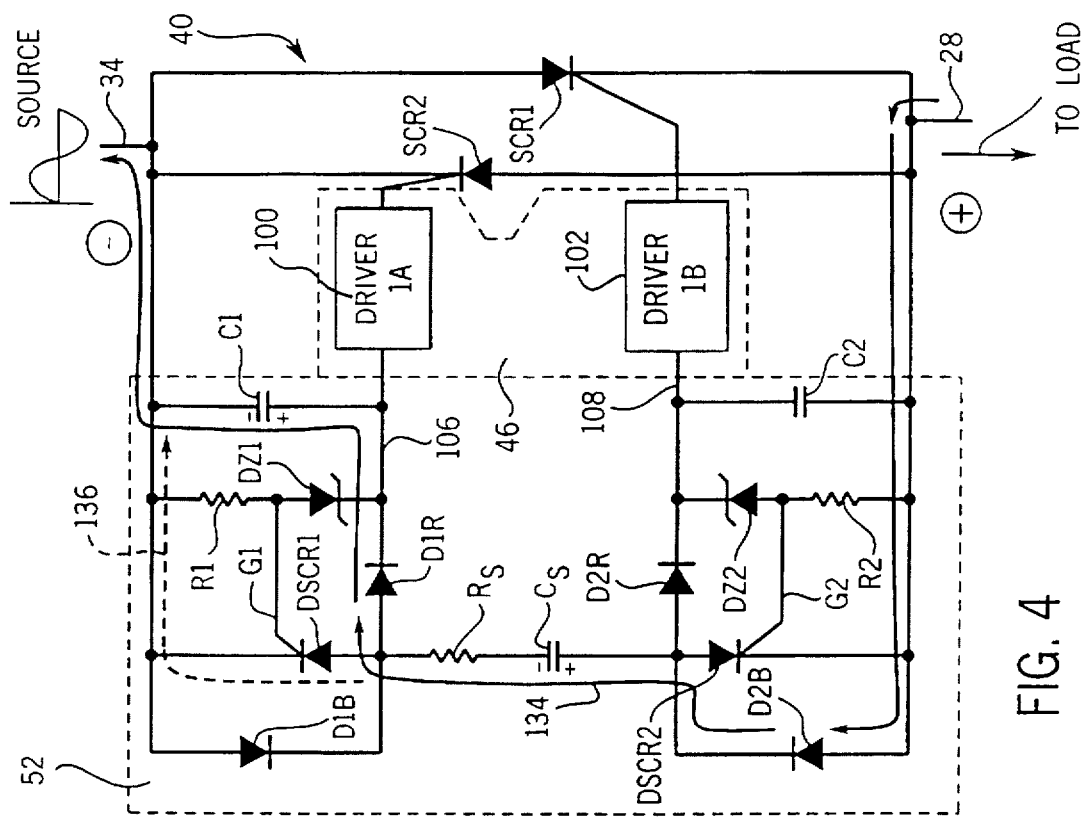
FIG. 4 is similar to FIG. 3 except that it shows operation during a negative half-cycle of the supply voltage.

Next, referring to FIGS. 2a, 2b and 4, during negative supply voltage half-cycles T2 during the power up process, terminal 28 is positive with respect to line 34 and therefore current travels from terminal 28 to line 34. With both of the thyristors SCR1 and SCR2 off, the path of current is along the path indicated by arrow 134 from terminal 28 through the second bypass diode D2B, through the snubber capacitor $C_s$, the snubber resistor $R_s$, the first regulating diode D1R and the first capacitor C1. In this case, both the snubber capacitor $C_s$ and the first capacitor C1 charge with their bottom plates positive as illustrated.

Eventually the first capacitor C1 becomes charged to the point where its charge exceeds the clamp value of the first zener diode DZ1. At this point, voltage at the anode of the first zener diode DZ1 provides a gate current to the first diverting thyristor DSCR1 turning on the first diverting thyristor DSCR1 so that current passes therethrough along the path indicated by dashed arrow 136 and limiting the first capacitor C1 charge to a maximum value.

After only a few cycles of the sinusoidal supply voltage on line 34 with the first and second thyristors SCR1 and SCR2 off, both the first and second capacitors C1 and C2 are fully charged and thus provide power at leads 106 and 108, respectively. After the initial power up procedure is completed and the first and second capacitors C1 and C2 are completely charged, normal motor control can begin.

2. Post Power Up

Referring again to FIGS. 2a, 2b and 3, initially, it will be assumed that prior to time $t_2$ both the first and second thyristor SCR1 and SCR2 have been off during the initial power up process and that, by time $t_2$ the power up process is complete and both the first and second capacitors C1 and C2 are fully charged. In this case, during the supply voltage positive half-cycle T1 prior to time $t_2$, the second capacitor C2 and the snubber capacitor $C_s$ are charged with the polarities shown in FIG. 3.

Figure 5:
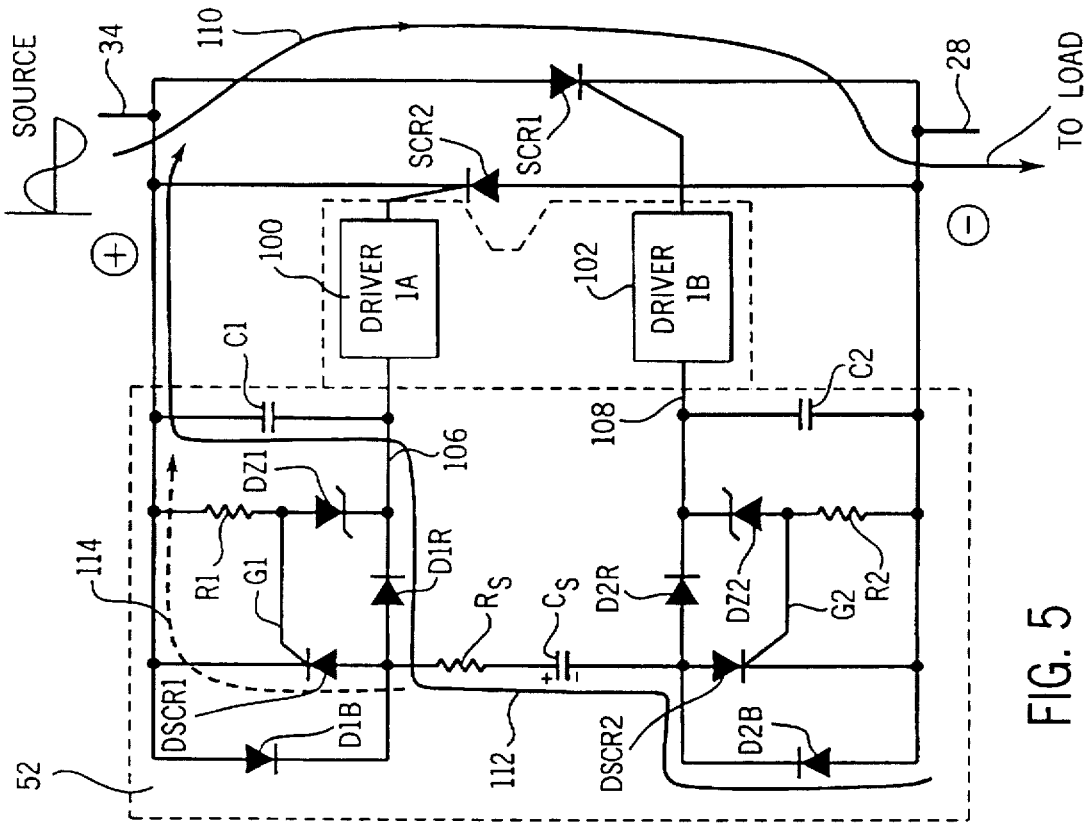

Referring to FIGS. 2a, 2b and 5, at time $t_2$, when the first thyristor SCR1 is turned on, current is supplied therethrough along the path indicated by arrow 110 to the terminal 28, thus causing terminal current 31 shown in FIG. 2b. In addition, at time $t_2$, because the snubber capacitor $C_s$ is charged as shown in FIG. 5, the snubber capacitor $C_s$ operates as a battery and provides current to the first capacitor C1 as illustrated by arrow 112 which passes from the snubber capacitor $C_s$ through the snubber resistor $R_s$ and the first regulating diode D1R. The snubber capacitor $C_s$ draws current through the second bypass diode D2B therebelow. Thus, when the first thyristor SCR1 is turned on the charge stored in the snubber capacitor $C_s$ charges the first capacitor C1.

When the charge on the first capacitor C1 exceeds the clamp value of the first zener diode DZ1, the first diverting thyristor DSCR1 is turned on and snubber capacitor current passes through the diverting thyristor DSCR1 as shown by dashed arrow 114.

Referring still to FIGS. 2a, 2b and 5, the first thyristor SCR1 remains on until time $t_4$ at which point the current therethrough becomes zero and the first thyristor SCR1 turns off. As can be seen in FIG. 2a, the line voltage 27 changes from positive to negative polarity at time $t_3$ between the time $t_2$ when the first thyristor SCR1 is turned on and the time $t_4$ when the first thyristor SCR1 turns off.

Figure 8:
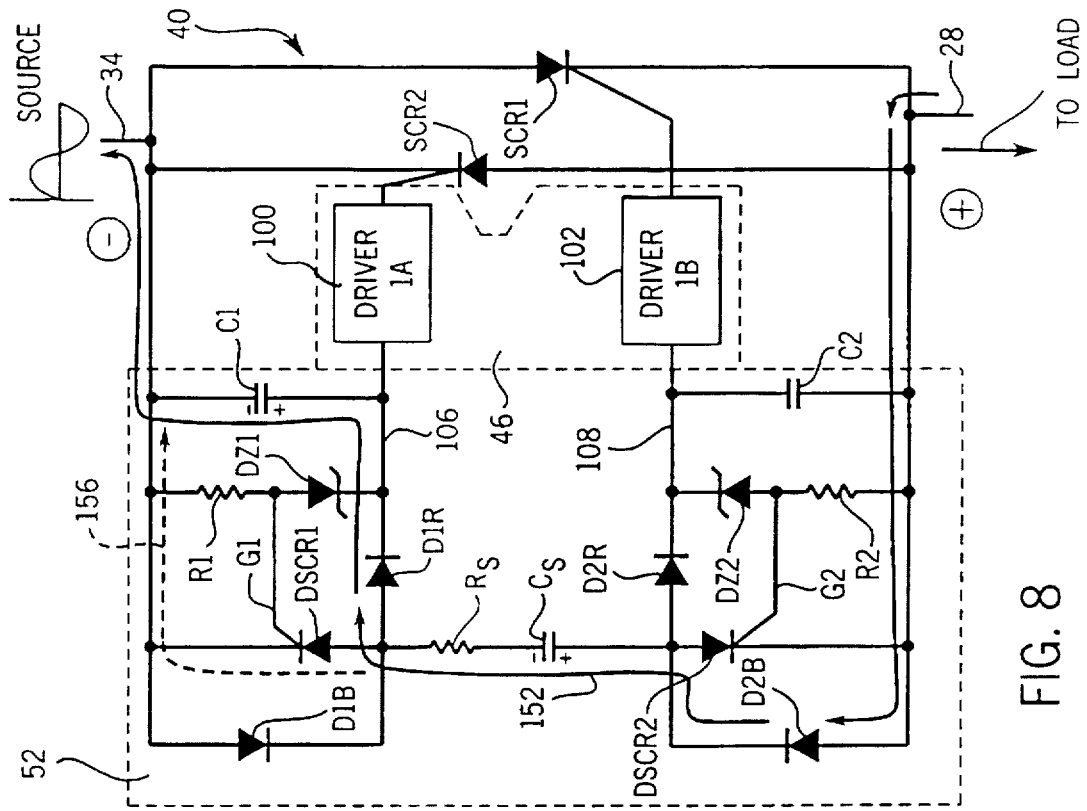
FIG. 8 is similar to FIG. 4 except that the second thyristor is turned off.

Referring to FIG. 8, the first thyristor SCR1 turns off during a negative supply voltage half-cycle T2 and therefore, the voltage level at line 34 is negative with respect to the voltage level at terminal 28. For this reason, when the first thyristor SCR1 turns off, current passes along the path indicated by arrow 152 back from terminal 28 through the second bypass diode D2B, through the snubber capacitor $C_s$ and the snubber resistor $R_s$, through the first regulating diode D1R and again charges the first capacitor C1. Once again, when the charge on the first capacitor C1 exceeds the clamp value of the first zener diode DZ1, the first diverting thyristor DSCR1 is turned on and current passes therethrough as indicated by arrow 156 so that the maximum charge on the first capacitor C1 is limited.

Thus, it should be appreciated that during normal motor control operation, the first capacitor C1 is charged during two distinct occurrences or time periods. First, when the first thyristor SCR1 is turned on, the snubber capacitor $C_s$ provides current to the first capacitor C1. Second, when the first thyristor SCR1 is turned off, current passing through the circuit from the terminal 28 charges the first capacitor C1.

Figure 6:
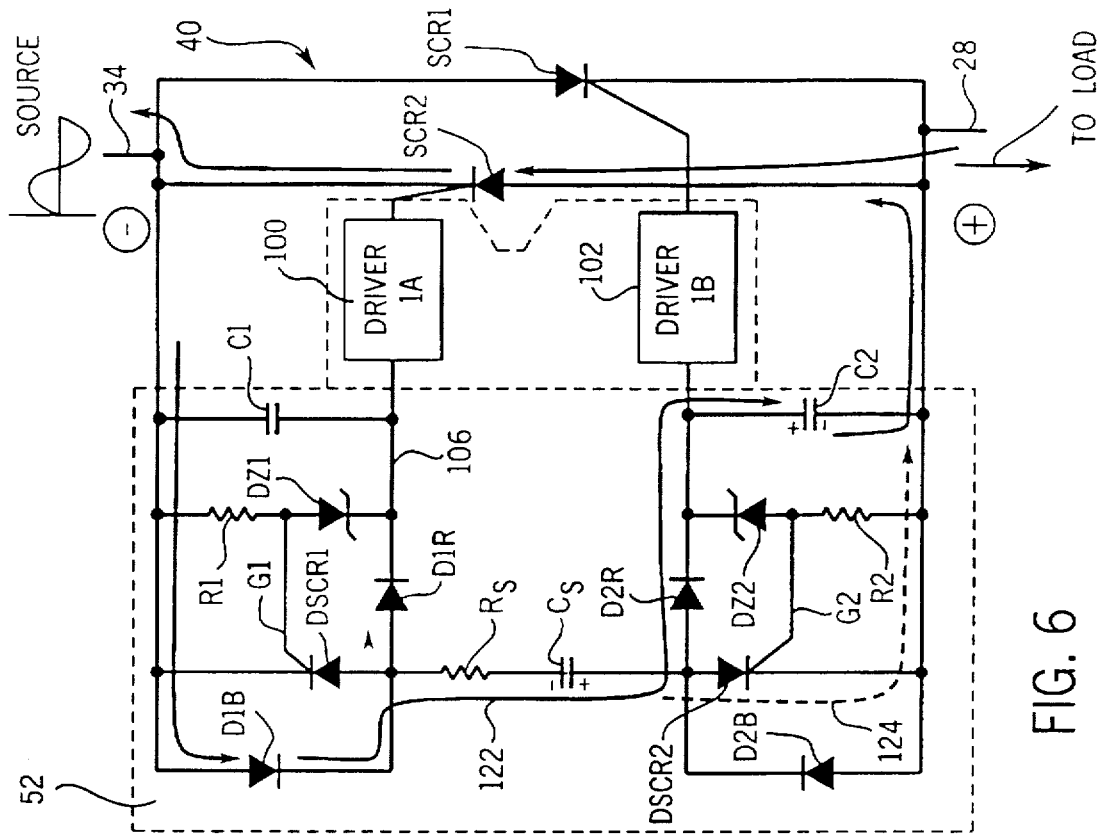

Similarly, the second capacitor C2 is charged during two distinct circuit occurrences. Referring now to FIGS. 2a, 2b and 4, between times $t_4$ and $t_5$ both the first and second thyristors SCR1 and SCR2 are off and therefore the negative half-cycle of supply voltage causes the snubber capacitor $C_s$ to charge as illustrated. Referring to FIG. 6, at time $t_5$, the second thyristor SCR2 is turned on and current passes from terminal 28 through the second thyristor SCR2 to the supply line 34. In this case, the charge on the snubber capacitor $C_s$ operates as a battery drawing current along the path indicated by arrow 122 through the first bypass diode D1B and the snubber resistor $R_s$ and forcing current through the second regulating diode D2R down into the second capacitor C2 which charges the second capacitor C2 as illustrated.

Once the charge on the second capacitor C2 exceeds the clamp value of the second zener diode DZ2, the second diverting thyristor DSCR2 is turned on allowing current to pass therethrough along the path illustrated by arrow 124 so that the charge on the second capacitor C2 is limited to the maximum value.

In FIG. 2a, at time $t_0$ at the right hand side of the graph, the sinusoidal supply voltage 27 again passes into a positive half-cycle T1. In FIG. 2a, because the supply voltage 27 and terminal voltage 29 are sinusoidally cyclical, the positive half-cycle T1 at the left hand portion of FIG. 2a would simply be repeated at the right hand portion after time $t_0$. To simplify FIG. 2a only one positive T1 and one negative T2 half-cycle have been illustrated. Assuming the positive half-cycle T1 in FIG. 2a is repeated after the negative half-cycle T2, the beginning of the next positive half-cycle T1 is illustrated at the left hand side of FIG. 2a.

The second thyristor SCR2 remains on until time $t_1$ when, as seen in FIG. 2b, the current 31 through the second thyristor SCR2 reaches zero. Between times $t_5$ and $t_1$, at time $t_0$, the polarity of the supply voltage 27 changes from negative to positive.

Figure 7:
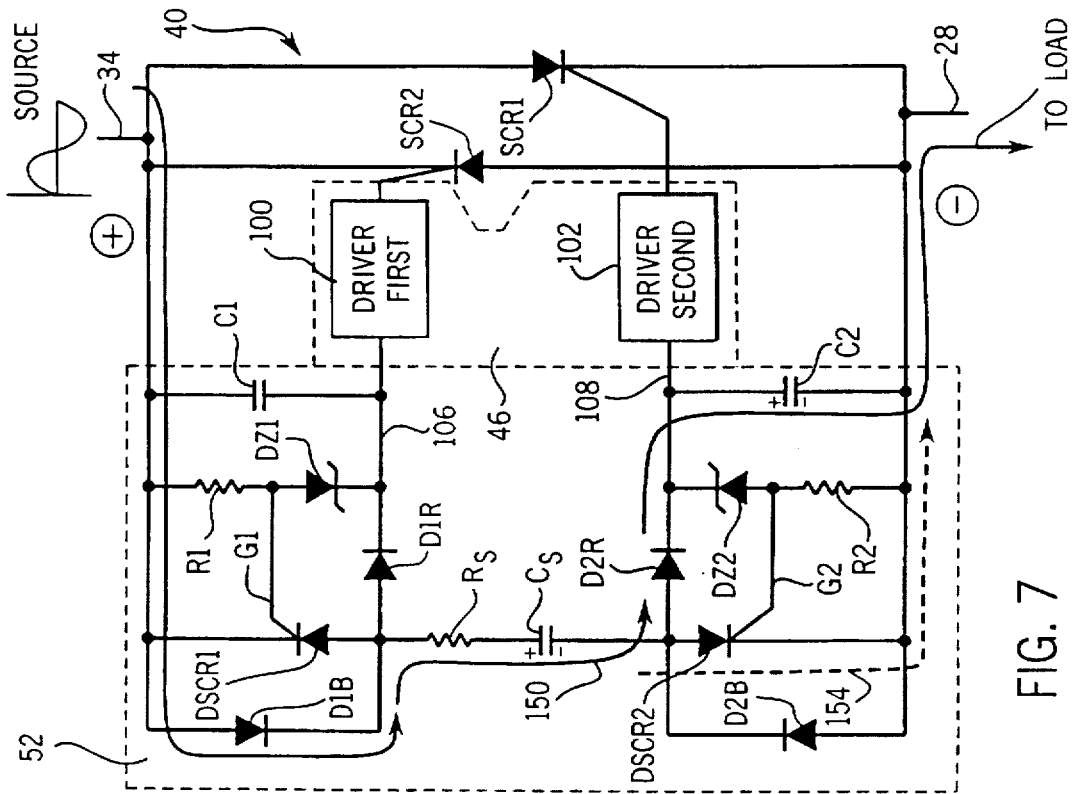
FIG. 7 is similar to FIG. 3 except that the first thyristor is turned off.

Referring also to FIG. 7, at time $t_1$ when the second thyristor SCR2 turns off, the voltage on supply line 34 is positive with respect to the voltage at terminal 28. In this case, when the second thyristor SCR2 turns off, current passes along the path illustrated by arrow 150 from supply line 34 through the first bypass diode D1B, the snubber resistor $R_s$, the snubber capacitor $C_s$, the second regulating diode D2R and down through the second capacitor C2 charging both the snubber capacitor $C_s$ and the second capacitor C2 as illustrated. Again, when the charge on the second capacitor C2 exceeds the clamp value of the second zener diode DZ2, the second diverting thyristor DSCR2 is turned on and current passes along the path illustrated by dashed arrow 154 which limits the maximum charge on the second capacitor C2.

Thus, the second capacitor C2 is charged during two distinct circuit occurrences or periods of operation. First, when the second thyristor SCR2 is turned on, the snubber capacitor $C_s$ discharges into the second capacitor C2 to charge the second capacitor C2. Second, when the second thyristor SCR2 turns off, the line voltage on line 34 charges both the snubber capacitor $C_s$ and the second capacitor C2.

It should be appreciated that the present invention provides a simple circuit having a small number of inexpensive and durable components which cooperate together to store some power provided on the supply line which would otherwise be dissipated in the snubber circuit and uses the stored power to provide energy required to drive the first and second drivers 100 and 102. Therefore, additional components, and in particular, separate power supplies for each driver, are not required where the present invention is implemented.

It should also be appreciate that the methods and apparatuses described above are only exemplary and do not limit the scope of this invention, and that various modification could be made by those skilled in the art that would fall under the scope of the invention. For example, while the present invention is described as being used in motor controls, clearly, the invention could be used in any other type of circuit where thyristor switching devices are used to alter AC input voltage. In addition, while the circuit illustrated includes a mechanism for limiting the maximum charge on the first and second capacitors C1 and C2, clearly the invention could be practiced without such a limiting mechanism. Moreover, higher powered systems could be provided by including the inventive circuit in a parallel relationship with another similar circuit and connecting the output terminals 28 together.

Furthermore, the RC snubber network may be more complex or include a bank of snubber capacitors or the first and second capacitors may each include a separate bank of capacitors.

To apprise the public of the scope of this invention, we make the following claims:

We claim:

1. A circuit for turning on at least first and second thyristors, each thyristor having an anode, a cathode and a gate electrode, the anode and cathode of the first thyristor connected to the cathode and anode of the second thyristor, respectively, the first thyristor anode connected to a voltage source providing a substantially sinusoidal voltage and the first thyristor cathode connected to a load terminal, the circuit comprising:

a driver linked to the thyristor gate electrodes for turning on the thyristors, the driver including a power lead for receiving power required to drive the driver;

a snubber voltage storer linked between the anode and the cathode of the first thyristor which charges when either of the thyristors is turned off and discharges when either of the thyristors is turned on; and a rechargeable voltage storer linked to and chargeable by the snubber storer when either of the thyristors is turned on and chargeable by the voltage source when both of the thyristors are off or either of the thyristors is turned off, the rechargeable voltage storer linked to the driver to supply power thereto.

2. The circuit of claim 1 wherein the at least two thyristors include two thyristors and the driver includes first and second drivers, the first driver connected to the second thyristor gate electrode and the second driver connected to the first thyristor gate electrode, the rechargeable voltage storer includes first and second rechargeable storers linked to the snubber storer, the first rechargeable storer linked to the first driver to supply power thereto and the second rechargeable storer linked to the second driver to supply power thereto, wherein:

the first rechargeable storer is chargeable by the snubber storer when the first thyristor is turned on and chargeable by the voltage source when the first thyristor is turned off and the voltage at the first thyristor anode is negative; and the second rechargeable storer is chargeable by the snubber storer when the second thyristor is turned on and chargeable by the voltage source when the second thyristor is turned off and the voltage at the first thyristor anode is positive.

3. The circuit of claim 2 wherein the snubber storer includes a capacitor in series with a resistor.

4. The circuit of claim 2 wherein the first rechargeable storer includes a first power capacitor connected between the first driver power lead and the second thyristor cathode and the second rechargeable storer includes a second power capacitor connected between the second driver power lead and the first thyristor cathode.

5. The circuit of claim 4 wherein the first rechargeable storer also includes a first zener diode having an anode linked to the anode of the first thyristor and a cathode linked to the first power lead, a first diverting thyristor having an anode linked to the cathode of the first zener diode, a cathode linked to the second thyristor cathode and a gate terminal connected to the first zener diode anode and a first bypass diode having an anode connected to the second thyristor cathode and a cathode connected to the first diverting thyristor anode and the second rechargeable storer also includes a second zener diode having an anode linked to the anode of the second thyristor and a cathode linked to the second power lead, a second diverting thyristor having an anode linked to the cathode of the second zener diode, a cathode linked to the first thyristor cathode and a gate terminal connected to the second zener diode anode and a second bypass diode having an anode connected to the first thyristor cathode and a cathode connected to the second diverting thyristor anode, and, wherein the snubber storer is linked to the first thyristor anode through the first bypass diode and linked to the first thyristors cathode through the second bypass diode.

6. The circuit of claim 5 wherein the recharger further includes a first resistor linking the first zener diode anode to the second thyristor cathode and the recharger further includes a second resistor linking the second zener diode anode to the first thyristor cathode.

7. A circuit for turning on first and second thyristors, each thyristor having an anode, a cathode and a gate electrode, the anode and cathode of the first thyristor connected to the cathode and anode of the second thyristor, respectively, the first thyristor anode connected to a voltage source providing a substantially sinusoidal voltage and the first thyristor cathode connected to a load terminal, the circuit comprising:

first and second drivers, the first driver connected to the second thyristor gate electrode for turning on the second thyristor and the second driver connected to the first thyristor gate electrode for turning on the first thyristor each of the first and second drivers including a separate power lead for receiving power required to drive the drivers;

a snubber voltage storer including a capacitor in series with a resistor linked between the anode and the cathode of the first thyristor which charges when either of the thyristor is turned off and discharges when either of the thyristors is turned on; and first and second rechargeable voltage storers linked to and chargeable by the snubber storer, the first rechargeable storer linked to the first driver to supply power thereto and the second rechargeable storer linked to the second driver to supply power thereto, wherein:

the first rechargeable storer is chargeable by the snubber storer when the first thyristor is turned on and chargeable by the voltage source when the first thyristor is off and the voltage at the first thyristor anode is negative; and the second rechargeable storer is chargeable by the snubber storer when the second thyristor is turned on and chargeable by the voltage source when the second thyristor is off and the voltage at the first thyristor anode is positive.

8. The circuit of claim 7 wherein the first rechargeable storer includes a first power capacitor connected between the first driver power lead and the second thyristor cathode and the second rechargeable storer includes a second power capacitor connected between the second driver power lead and the first thyristor cathode.

9. The circuit of claim 8 wherein the first rechargeable storer also includes a first zener diode having an anode linked to the anode of the first thyristor and a cathode linked to the first power lead, a first diverting thyristor having an anode linked to the cathode of the first zener diode, a cathode linked to the second thyristor cathode and a gate terminal connected to the first zener diode anode, a first bypass diode having an anode connected to the second thyristor cathode and a cathode connected to the first diverting thyristor anode and a first resistor linking the first zener diode anode to the second thyristor cathode and a first regulating diode having an anode connected to the first diverting thyristor anode and a cathode connected to the cathode of the first zener diode and the second rechargeable storer also includes a second zener diode having an anode linked to the anode of the second thyristor and a cathode linked to the second power lead, a second diverting thyristor having an anode linked to the cathode of the second zener diode, a cathode linked to the first thyristor cathode and a gate terminal connected to the second zener diode anode, a second bypass diode having an anode connected to the first thyristor cathode and a cathode connected to the second diverting thyristor anode and a second resistor linking the second zener diode anode to the first thyristor cathode and a second regulating diode having an anode connected to the second diverting thyristor anode and a cathode connected to the cathode of the second zener diode.

10. A method for providing power to drivers for turning on two inversely connected thyristors, each thyristor having an anode, a cathode and a gate electrode, the anode and cathode of the first thyristor connected to the cathode and anode of the second thyristor, respectively, the first thyristor anode connected to a voltage source providing a substantially sinusoidal voltage and the first thyristor cathode connected to a load terminal, the method to be used with a circuit including a first driver connected to the second thyristor gate electrode for turning on the second thyristor and a second driver connected to the second thyristor gate electrode for turning on the first thyristor, each of the first and second drivers including a power lead for receiving power required to drive the drivers, a snubber voltage storer that is linked between the first thyristor's anode and cathode and first and second rechargeable voltage storers that are linked to the snubber storer, the first rechargeable storer also linked to the first driver power lead and the second rechargeable storer also linked to the second driver power lead, the method comprising the steps of:

when the first thyristor turns off, charging both the snubber storer and the first rechargeable storer using the voltage source;

when the second thyristor turns on discharging the snubber storer charge into the second rechargeable storer;

when the second thyristor is turned off, charging both the snubber storer and the second rechargeable storer using the voltage source; and when the first thyristor turns on discharging the snubber storer charge into the second rechargeable storer;

wherein the first and second rechargeable storers are recharged during every cycle of the sinusoidal voltage.

11. The method of claim 10 wherein each of the steps of charging the rechargeable storers includes the step of limiting the charge of each of the storers.

* * * * *